US009287599B1

(12) United States Patent
White et al.

(10) Patent No.: US 9,287,599 B1
(45) Date of Patent: Mar. 15, 2016

(54) MINIATURE TUNABLE FILTER

(75) Inventors: Christopher John White, Palo Alto, CA (US); James R. White, San Mateo, CA (US); Jay W. Walker, Half Moon Bay, CA (US); David T. Huang, Milpitas, CA (US)

(73) Assignee: Active Spectrum, Inc., Foster City, CA (US)

( * ) Notice: Subject to any disclaimer, the term of this patent is extended or adjusted under 35 U.S.C. 154(b) by 512 days.

(21) Appl. No.: 13/179,409

(22) Filed: Jul. 8, 2011

Related U.S. Application Data

(60) Provisional application No. 61/474,663, filed on Apr. 12, 2011.

(51) Int. Cl.
*H01P 1/205* (2006.01)
*H01P 7/04* (2006.01)

(52) U.S. Cl.
CPC ............... *H01P 1/2056* (2013.01); *H01P 7/04* (2013.01)

(58) Field of Classification Search
CPC .......... H01P 7/04; H01P 1/202; H01P 1/2056
USPC .................. 333/206, 207, 202, 203, 222, 223
See application file for complete search history.

(56) References Cited

U.S. PATENT DOCUMENTS

| 3,253,231 | A | * | 5/1966 | Smith, Jr. | 331/82 |
| 4,179,673 | A | * | 12/1979 | Nishikawa et al. | 333/204 |
| 5,329,687 | A | * | 7/1994 | Scott et al. | 29/527.2 |
| 5,691,672 | A | * | 11/1997 | Cruchon et al. | 333/26 |
| 5,847,627 | A | * | 12/1998 | Radzikowski et al. | 333/202 |
| 7,205,868 | B2 | * | 4/2007 | Park et al. | 333/203 |
| 7,714,680 | B2 | | 5/2010 | Vangala et al. | |
| 7,898,367 | B2 | | 3/2011 | Morga et al. | |
| 7,983,649 | B2 | * | 7/2011 | Eddy et al. | 455/341 |
| 2008/0258847 | A1 | * | 10/2008 | Snyder | 333/207 |
| 2009/0251026 | A1 | * | 10/2009 | Kang et al. | 310/323.16 |

OTHER PUBLICATIONS

Snyder, R.V., et al, "Bandstop filter design using evanescent mode resonators," 2003 IEEE MTT-S Digest, pp. 1073-1076.
"The Coaxial Cavity as a Radio-frequency Tuner," Very High-Frequency Techniques (compiled by the Radio Research Laboratory Harvard University). vol. II, Chapter 28-17, pp. 769-787, Mc-Graw Hill Book Company, Inc. New York and London 1947.

* cited by examiner

*Primary Examiner* — Benny Lee
*Assistant Examiner* — Jorge Salazar, Jr.
(74) *Attorney, Agent, or Firm* — Tope-McKay & Associates

(57) ABSTRACT

Described is a miniature tunable filter, comprising at least two adjacent coaxial-type resonators coupled to one another. Each coaxial-type resonator comprises a metal-coated ceramic dielectric cavity having a tuning rod passage formed therethrough. A tuning rod is inserted through the tuning rod passage, such that the miniature tunable filter is tuned by moving the tuning rod into and out of the tuning rod passage of the ceramic dielectric cavity. A low impedance coaxial section surrounds at least a portion of the tuning rod to create an effective microwave short-circuit at a resonant frequency of the miniature tunable filter, which results in very wide tuning and low insertion loss. In a desired aspect, the tuning rod is a solid metal tuning rod. The combination of a solid metal tuning rod with a ceramic coaxial-type resonator results in high radio frequency power handling.

20 Claims, 12 Drawing Sheets

MINIATURE TUNABLE FILTER

GOVERNMENT LICENSE RIGHTS

This invention was made with government support under Contract No. FA8718-09-C-0057 awarded by the U.S. Air Force and Contract No. W15P7T-09-C-S491 awarded by the U.S. Army. The government has certain rights in the invention.

PRIORITY CLAIM

The present application is a Non-Provisional patent application of U.S. Provisional Patent Application No. 61/474,663, filed Apr. 12, 2011, entitled "Miniature Tunable Filter."

BACKGROUND OF THE INVENTION (1) Field of Invention

The present invention relates to a tunable filter and, more particularly, to a miniature tunable filter having high power and low loss capabilities.

(2) Description of Related Art

Tunable filters, typically used for multiband telecommunication systems, radiometers, and wideband radar systems, are electric filters in which the frequency of the passband or rejection band can be varied by adjusting its components. Several filter designs exist in the prior art. For instance, miniature ceramic filters use high dielectric constant ceramic materials to reduce the size of the filters; however, current designs are fixed frequency and have limited radio frequency (RF) power handling. Additionally, machined filters, such as Air Core filters, are large in size and are not suitable for mobile or lightweight applications. Furthermore, varactor tuned filters have high loss and a limited tuning range, especially at frequencies greater than 500 megahertz (MHz). Finally, Yttrium Iron Garnet (YIG) tuned filters have high direct current (DC) power consumption, limited RF power handling due to saturation of the ferrite material used, and have a typical frequency range of 2-40 gigahertz (GHz).

Thus, a continuing need exists for a miniature tunable filter which can be tuned over a wide range of frequencies and has low loss and high power capabilities.

SUMMARY OF THE INVENTION

The present invention relates to a tunable filter and, more particularly, to a miniature tunable filter having high power and low loss capabilities. The miniature tunable filter comprises at least two adjacent coaxial-type resonators coupled to one another. Each resonator comprises a ceramic dielectric cavity having a tuning rod passage therethrough and an exterior surface, wherein the exterior surface of the ceramic dielectric cavity comprises a metal coating. A mechanically tunable tuning rod is insertable into the ceramic dielectric cavity, wherein the miniature tunable filter is tuned by moving the mechanically tunable tuning rod into and out of the tuning rod passage of the ceramic dielectric cavity. A low impedance coaxial section surrounds at least a portion of the mechanically tunable tuning rod to create an effective microwave short-circuit at a resonant frequency of the miniature tunable filter.

In another aspect, the mechanically tunable tuning rod is a solid metal tuning rod.

In another aspect, at least a portion of the exterior surface of the mechanically tunable tuning rod is coated with a low-loss metal.

In another aspect, both the exterior surface of the ceramic dielectric cavity and the exterior surface of the mechanically tunable tuning rod comprise polished surfaces with low surface roughness for minimal radio frequency (RF) losses.

In another aspect, the miniature tunable filter further comprises a cavity coupling aperture between the at least two adjacent coaxial-type resonators, wherein the cavity coupling aperture couples microwave energy between each coaxial-type resonator.

In another aspect, the miniature tunable filter further comprises, an input coupling structure connected with each ceramic dielectric cavity for exciting the ceramic dielectric cavity.

In another aspect, the tuning rod passage is sized to provide a close fit between the tuning rod passage and the mechanically tunable tuning rod.

In another aspect, the miniature tunable filter further comprises a linear motor connected with the mechanically tunable solid metal tuning rod of each resonator for driving movement of the mechanically tunable tuning rod.

In another aspect, the linear motor is a miniature piezoelectric motor.

As can be appreciated by one in the art, the present invention also comprises a method for forming the miniature tunable filter described herein.

BRIEF DESCRIPTION OF THE DRAWINGS

The objects, features and advantages of the present invention will be apparent from the following detailed descriptions of the various aspects of the invention in conjunction with reference to the following drawings, where.

DETAILED DESCRIPTION

Figure 1:
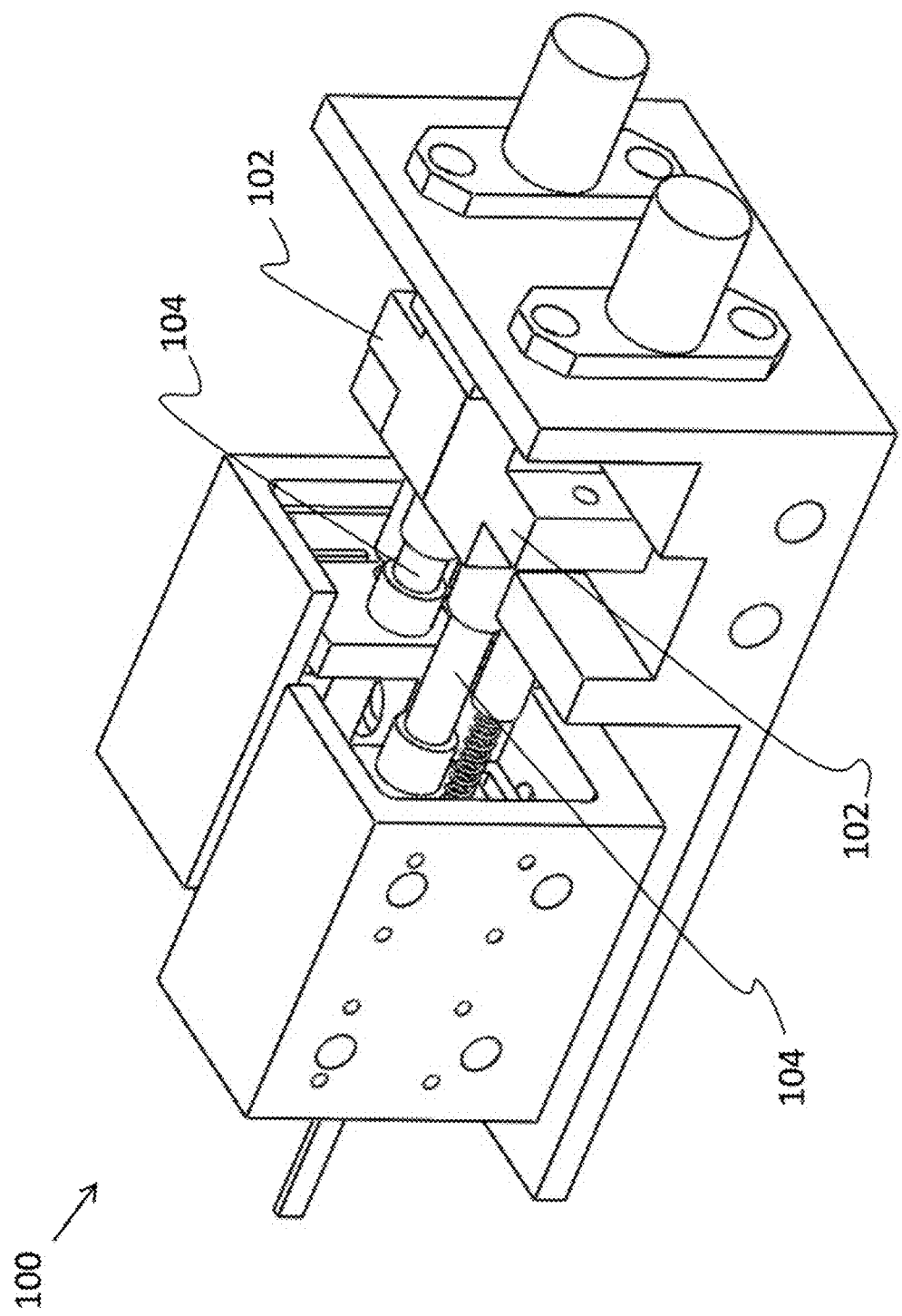
FIG. 1 is a perspective-view illustration of a miniature tunable filter according to the present invention.

The present invention relates to a tunable filter and, more particularly, to a miniature tunable filter having high power and low loss capabilities. The following description is presented to enable one of ordinary skill in the art to make and use the invention and to incorporate it in the context of particular applications. Various modifications, as well as a variety of uses, in different applications will be readily apparent to those skilled in the art, and the general principles defined herein may be applied to a wide range of embodiments. Thus, the present invention is not intended to be limited to the embodiments presented, but is to be accorded with the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Please note, if used, the labels left, right, front, back, top, bottom, forward, reverse, clockwise and counter-clockwise have been used for convenience purposes only and are not intended to imply any particular fixed direction. Instead, they are used to reflect relative locations and/or directions between various portions of an object. As such, as the present invention is changed, the above labels may change their orientation.

(1) Specific Details

The present invention relates to a miniaturized, widely tunable filter having high power and low loss capabilities. The tunable filter is tunable over a wide-range of frequencies and has high performance compared to existing tunable filters due to its unique design. Typically, tunable filters that operate at high power levels are very large in size. The present invention includes a hybrid construction which allows miniaturization as well as high power handling.

FIG. 1 illustrates a perspective-view of the interior portions of a tunable filter according to the present invention. The tunable filter 100 is a coaxial resonator-type filter, which is tuned mechanically by moving cylindrical center conductor tuning rods. The tunable filter described herein has a unique non-contact design. The electrical structure of the tunable filter makes an effective short circuit at radio frequency (RF) and microwave frequencies. There are no metal-metal junctions between the outer metal and inner tunable rods, since one would expect to see failure at such junctions due to high current at the junctions. In contrast, the tunable rods only contact dielectric cavities, which are comprised of a non-metal material. The non-contact design has been found to give minimum insertion loss and enhanced power handling, which will be presented in further detail below.

As a non-limiting example, and as shown in FIG. 1, the tunable filter 100 is comprised of two halves comprising two resonators. However, as can be appreciated by one skilled in the art, any suitable number of resonators could be used. Each resonator consists of a dielectric cavity 102 and a mechanically tunable rod 104. In a desired aspect, the tuning rods 104 are comprised of solid metal (e.g., steel) and may be electroplated or sputtered with a low-loss metal, non-limiting examples of which include silver and copper. Solid metal tuning rods 104 are an improvement over the prior art, as heat gets distributed throughout the material. Thus, the heat is better dissipated to prevent failure of the filter, which allows for high power capabilities. The combination of a solid metal tuning rod 104 with a ceramic coaxial type resonator results in high RF power handling, contrasting with the prior art where a thin metal coating is used to define the center conductor. The thin metal coating does not allow of distribution of the thermal heating of the center conductor rod, and may have an edge at the base of the rod which results in failure under high power.

The dielectric cavities 102 are composed of high dielectric constant microwave materials. Non-limiting examples of high dielectric materials for use in the present invention include ceramic, alumina, quartz, titanium dioxide, and any suitable high dielectric constant materials with small loss tangents at radio frequencies (RF) and microwave frequencies. As a non-limiting range, typical operating frequencies are in the range of 225 megahertz (MHz) to 18 gigahertz (GHz). Furthermore, the dielectric cavities 102 are resonant in a mode similar to a quarter-wave transverse electric and magnetic (TEM) mode cavity resonator. In a desired aspect and as described herein, the dielectric cavity 102 is comprised of a ceramic block which is coated on the exterior with a metal (e.g., silver) using a thick film or thin film metallization process.

Figure 2:
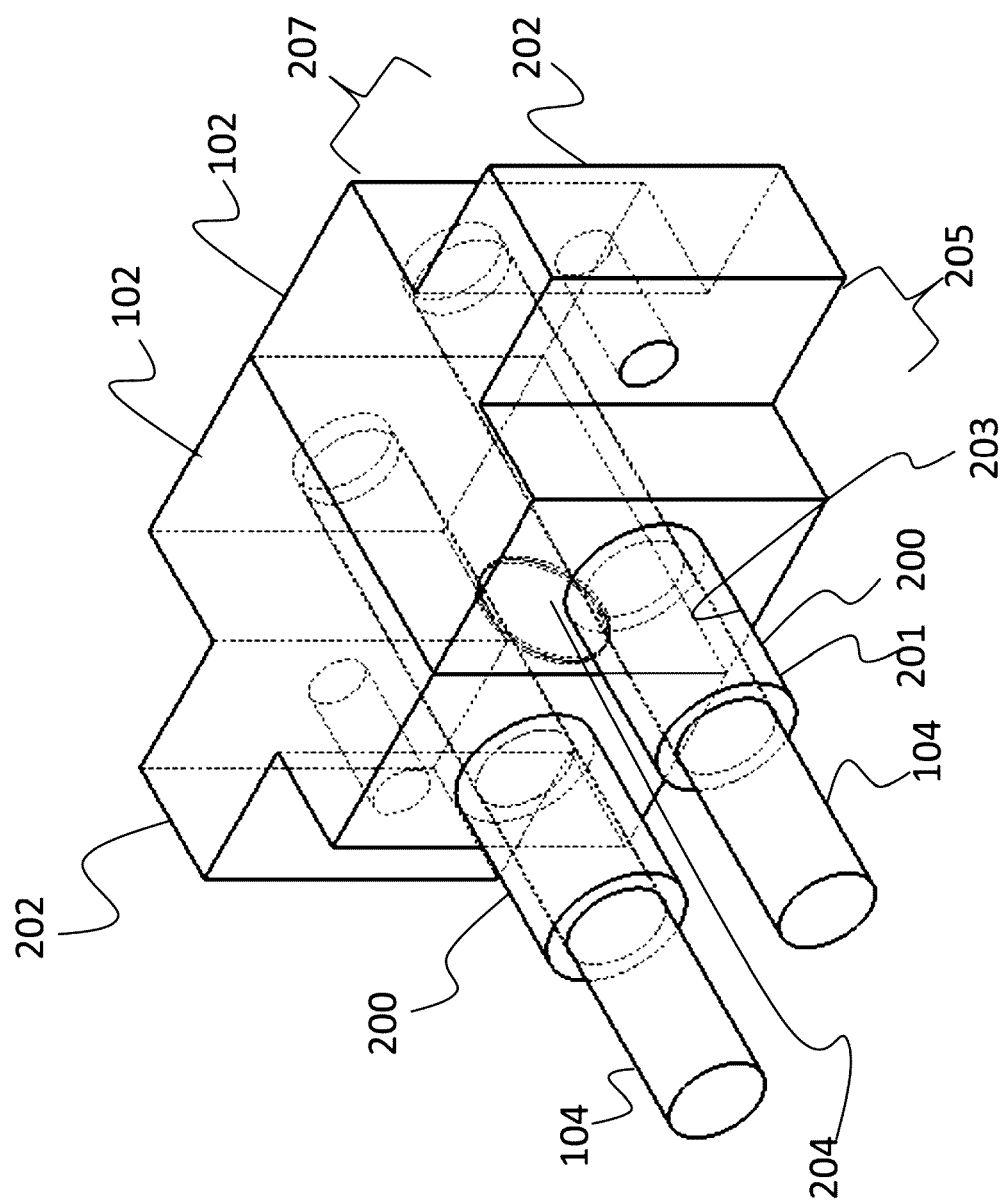
FIG. 2 is a perspective-view illustration of a set of dielectric cavities shown with tuning rods according to the present invention.

FIG. 2 is an illustration of two resonators of the tunable filter according to the present invention. In a desired aspect, a low impedance coaxial section 200 surrounds at least a portion of the tuning rod 104 and includes an exterior 201 and an interior surface 203. As depicted in FIG. 2, the low impedance coaxial section 200 is a cylindrical section surrounding the tuning rod 104. The low impedance coaxial section 200 is used to create an effective microwave short-circuit at the filter resonant frequency. The low impedance coaxial section 200 includes a metal coating on its exterior surface 201 similar to the dielectric cavity 102.

Outer polished surfaces are used on both the tuning rods 104 and the metal-coated ceramic blocks (i.e., dielectric cavities 102), for optimal RF performance (i.e. low insertion loss). Excellent polish and low surface roughness is needed to minimize RF losses because of the skin effect in microwave circuits. Additionally, the tunable filter includes input coupling structures 202 to excite the dielectric cavities 102. The distance 205 between the input coupling structures 202 and the tunable rods 104 (i.e., position of the input coupling structures 202) as well as the length 207 of the input coupling structures 202 can be adjusted to vary the coupling coefficient for the tunable filter. Therefore, the input coupling structures 202 can be designed with predetermined values in order to control the frequency variation of the input coupling for optimal results.

Further, the dielectric cavities 102 are coupled by a cavity coupling aperture 204, such as an iris aperture, or other coupling means, such as inductive or capacitive coupling. The cavity coupling aperture 204 allows coupling of microwave energy between each dielectric cavity 102, or each side of the tunable filter, as illustrated in FIG. 2. The cavity coupling aperture 204 between the two sides of the tunable filter can be optimized for minimum return loss across the tuning range by varying the diameter of the cavity coupling aperture 204 and its position. As a non-limiting example, the cavity coupling aperture 204 is 3.2 millimeters (mm) in diameter and centered at 2 mm from the base 206 of the tunable filter. Thus, both the input coupling structures 202 and the cavity coupling aperture 204 between the dielectric cavities 102 can be designed with specific, predetermined values in order to realize the designed filter characteristics. For instance, a desired filter might be characterized in terms of insertion loss, 3 decibel (dB) bandwidth, ripple, and maximum in-band return loss, among other factors.

As described above, each dielectric cavity 102 is coated on its external surface with a metal using a metallization process. The exceptions are the input coupling structures 202 and the cavity coupling aperture 204. In contrast to the rest of the dielectric cavity 102, the input coupling structures 202 and cavity coupling aperture 204 are defined by removing the metallization, which for the input structure is important for preventing a short-circuit.

Figure 3:
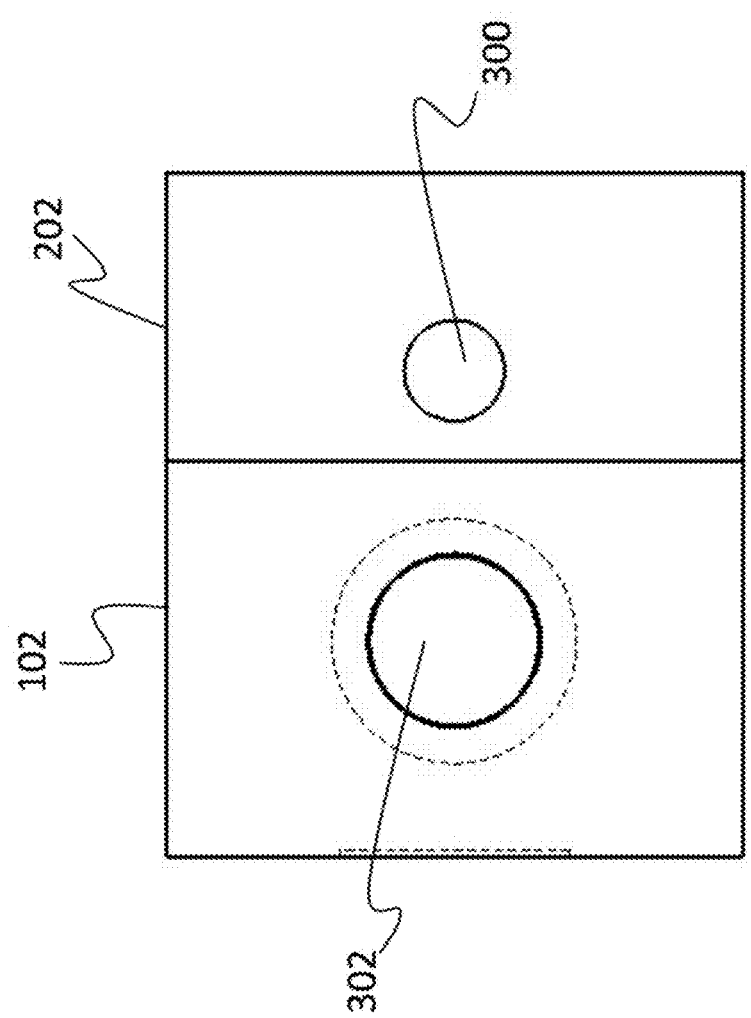
FIG. 3 is front-view illustration of a single dielectric cavity according to the present invention.

FIG. 3 depicts a front-view of a single ceramic dielectric cavity 102 of the tunable filter. An input coupling loop 300 of the input coupling structure 202 shown is a cylindrical passage drilled through the input coupling structure 202 portion of the dielectric cavity 102. The end of the input coupling loop 300 illustrated is the short-circuit end, while the opposite side (not shown) is the RF end. In other words, the side of the input coupling structure 202 closest to the low impedance coaxial section has a short circuit, while the opposite side is the RF end, which is connected to a coaxial cable. An additional passage is drilled through each dielectric cavity 102 to form a rod opening 302. The rod opening 302 is sized to provide a close, precision fit of the tuning rod to the rod opening 302 in the ceramic block for optimum RF performance (i.e., minimum air gap) while also creating a mechanical bushing.

Figure 4:
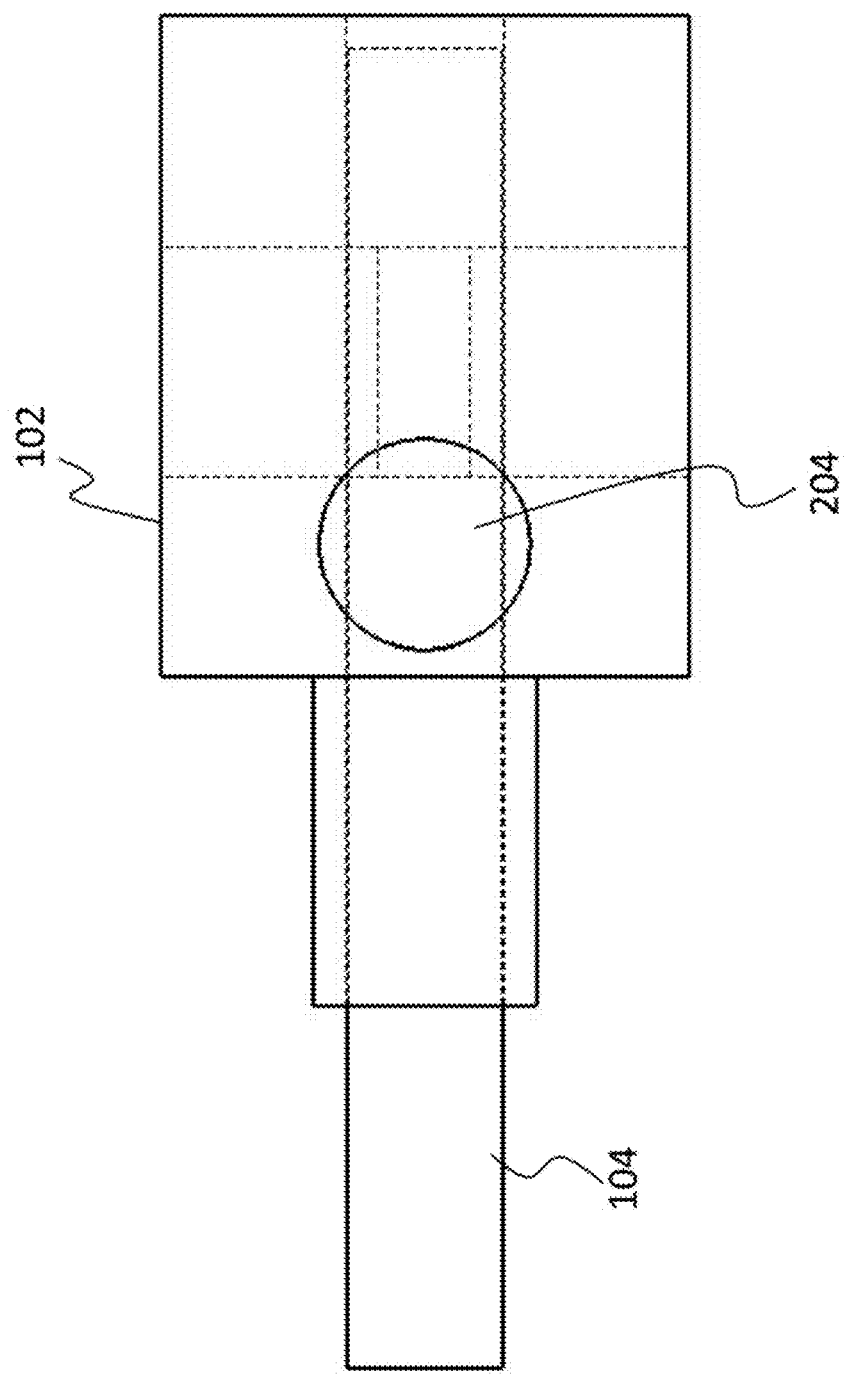
FIG. 4 is a side-view illustration of a single dielectric cavity shown with a timing rod according to the present invention.

FIG. 4 illustrates a side-view of a single dielectric cavity 102 shown with the metal tuning rod 104 inserted. Also clearly depicted is the cavity coupling aperture 204, which couples the two sides of the tunable filter (i.e., two dielectric cavities 102).

Figure 5:
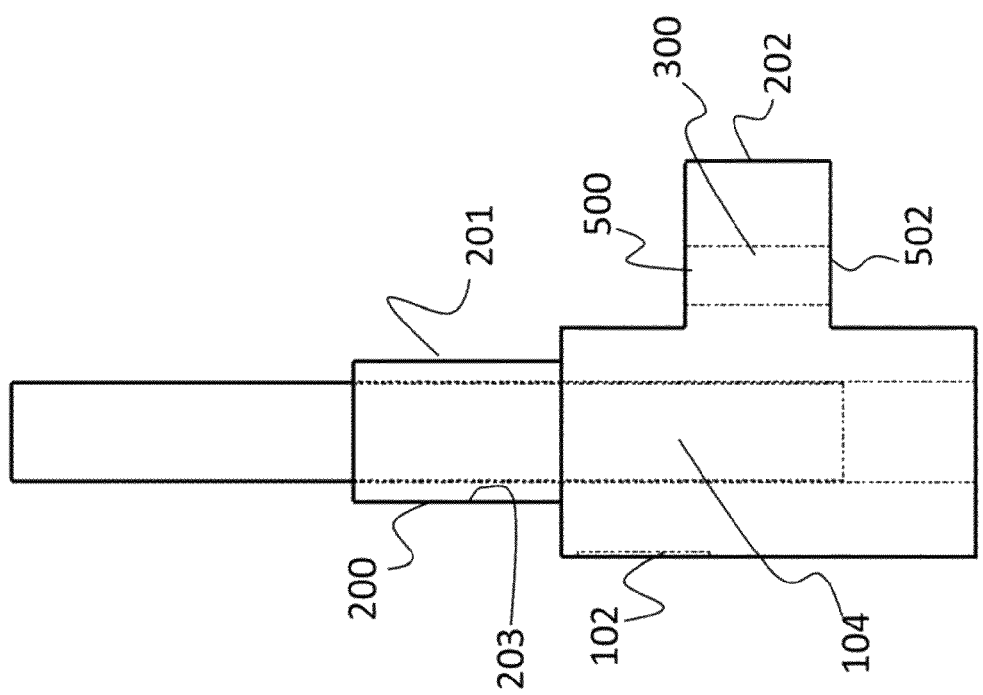
FIG. 5 is a top-view illustration of a single dielectric cavity shown with a tuning rod according to the present invention.

FIG. 5 is a top-view illustration of a single dielectric cavity 102 and tuning rod 104. As described above, the low impedance coaxial section 200 is coated on its exterior surface 201 with a metal coating. However, the interior surface 203 of the low impedance coaxial section 200 is not metalized. Thus, the non-contact, low impedance coaxial section 200 is used to synthesize a microwave short circuit, resulting in very wide tuning and low insertion loss. Significantly, the tunable filter design lacks metal-to-metal contact which would typically degrade RF performance because of the contact resistance. The short-circuit end 500 and the RF input end 502 of the input coupling loop 300 are also shown. As described above, the distance of the input coupling loop 300 to the tuning rod 104 can be varied to adjust coupling. Furthermore, the position of the input coupling structure 202 can be varied along the length of the dielectric cavity 102 to adjust the frequency response of coupling.

Figure 6:
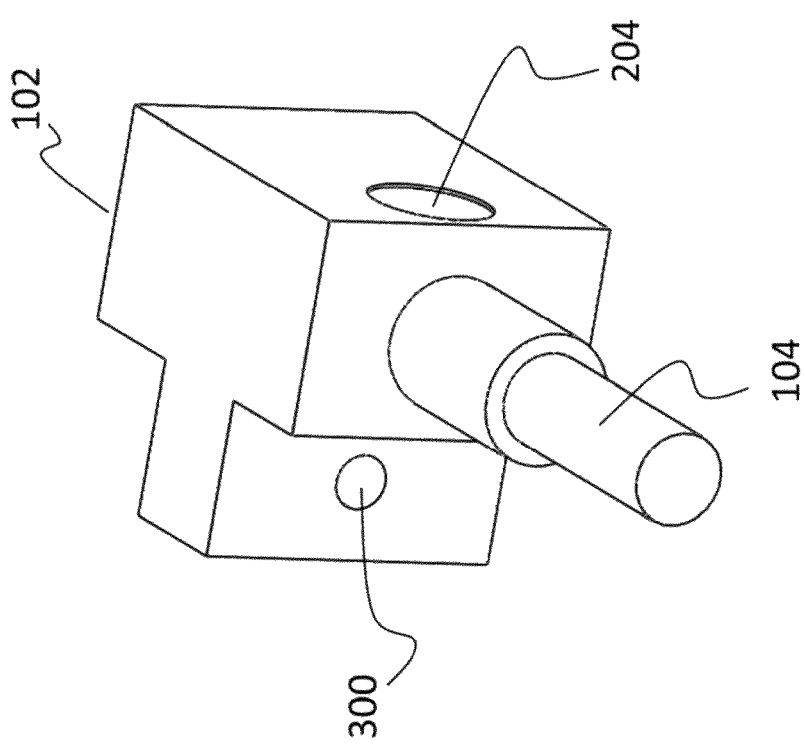
FIG. 6 is a perspective-view illustration of a single dielectric cavity shown with a tuning rod according to the present invention.
Figure 7:
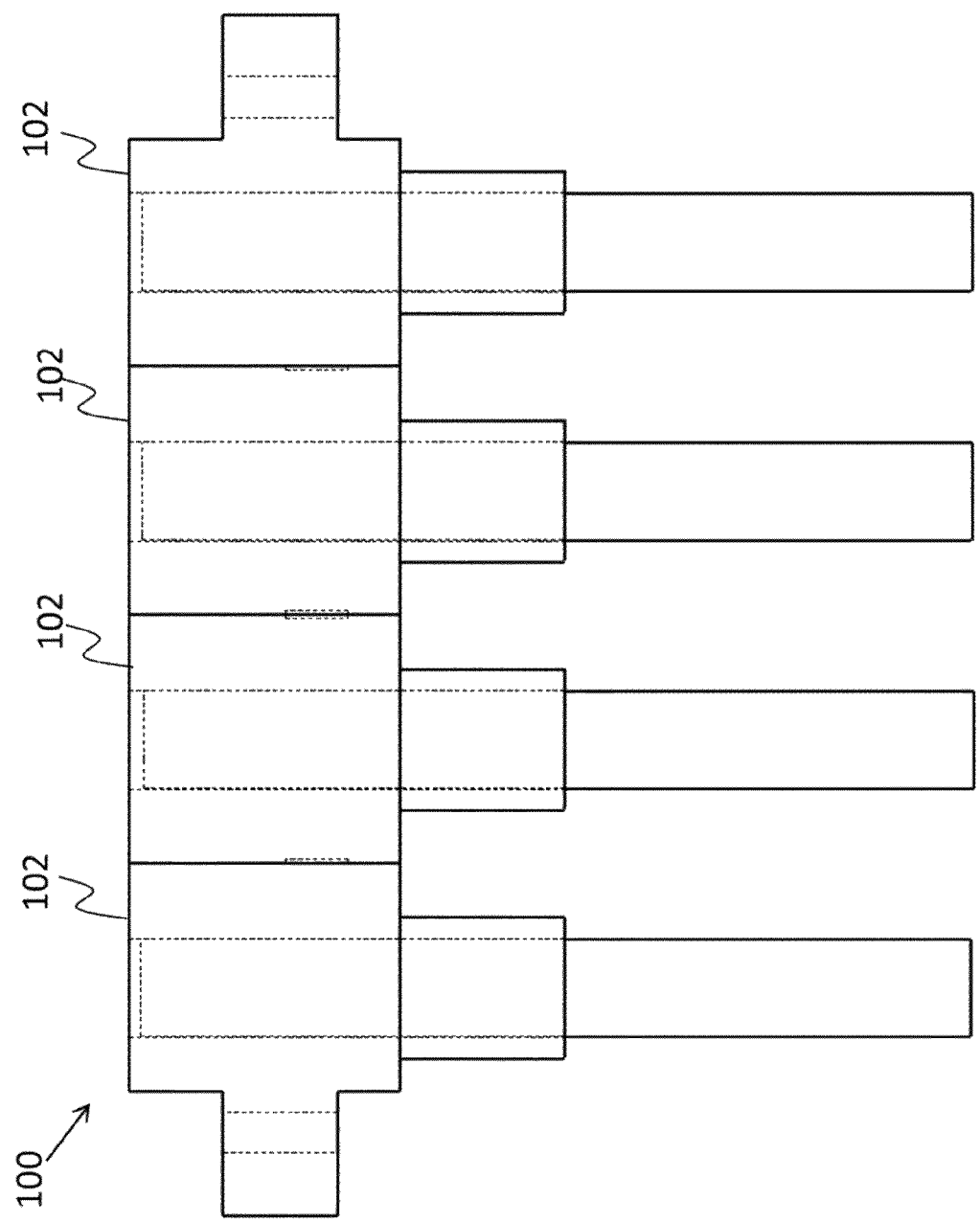
FIG. 7 is a perspective-view illustration of a 4-pole tunable filter according to the present invention.

FIG. 6 illustrates a perspective-view of a single dielectric cavity 102 and tuning rod 104. The removal of the metallization of the dielectric cavity 102 to form the cavity coupling aperture 204 is depicted. The view depicted in FIG. 6 shows the end of the input coupling loop 300 which is shorted to ground. FIG. 7 depicts a 4-pole tunable filter 100 having four dielectric cavities 102, which would include the same functional components as the two-pole design described above.

Figure 8:
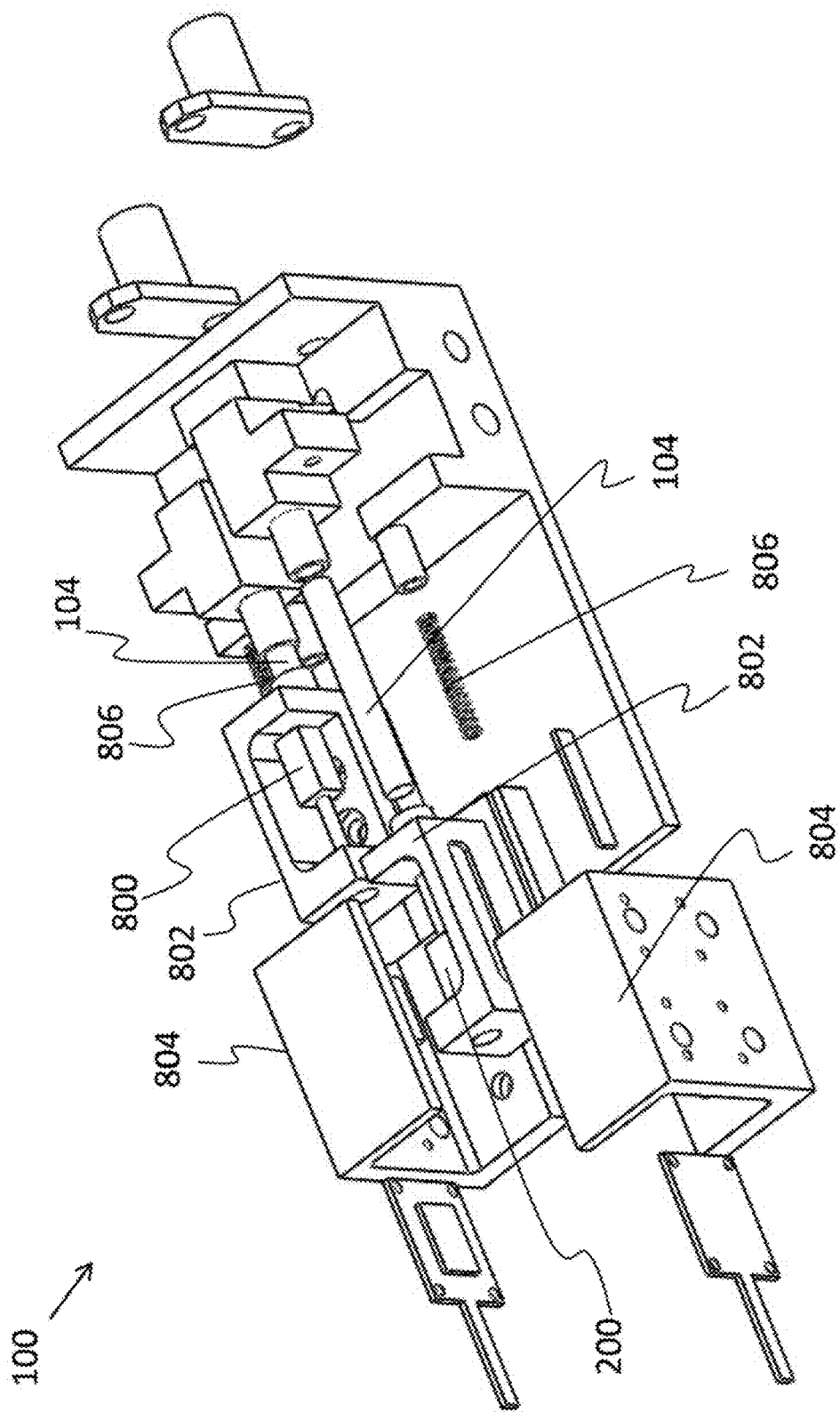
FIG. 8 is an exploded-view illustration of a miniature tunable filter according to the present invention.

FIG. 8 illustrates an exploded-view of the tunable filter 100. In a desired aspect, linear motors 800, a non-limiting example of which includes small piezoelectric motors, are connected with the tuning rods 104 and are used to move the tuning rods 104. Each linear motor 800 is comprised of a motor shaft and body. In a desired aspect, the motor shaft is threaded. A controller board is used to drive the motors. As can be appreciated by one skilled in the art, any controller board that performs the desired function of controlling the motors may be used. As a non-limiting example, a controller board that employs an I2C bus architecture may be utilized. The controller board can also be integrated using commercially available ASICs. The motors operate closed-loop to tune the tuning rods 104. In one aspect, the tunable filter 100 can be tuned repeatedly as needed for different applications due to the presence of the linear motor 800.

Each linear motor 800 is surrounded by a motor adaptor 802 which stabilizes the linear motor 800 and constrains the tunable rod 104. A motor mounting element 804 surrounds at least a portion of each linear motor 800 and each motor adaptor 802. A spring 806 provides a pre-load force upon the motor shaft and body. The act of the spring 806 uncompressing forces the threaded motor shaft to be biased against the back of the motor body. This is to ensure constant thread engagement and remove backlash for increased accuracy.

Figure 9:
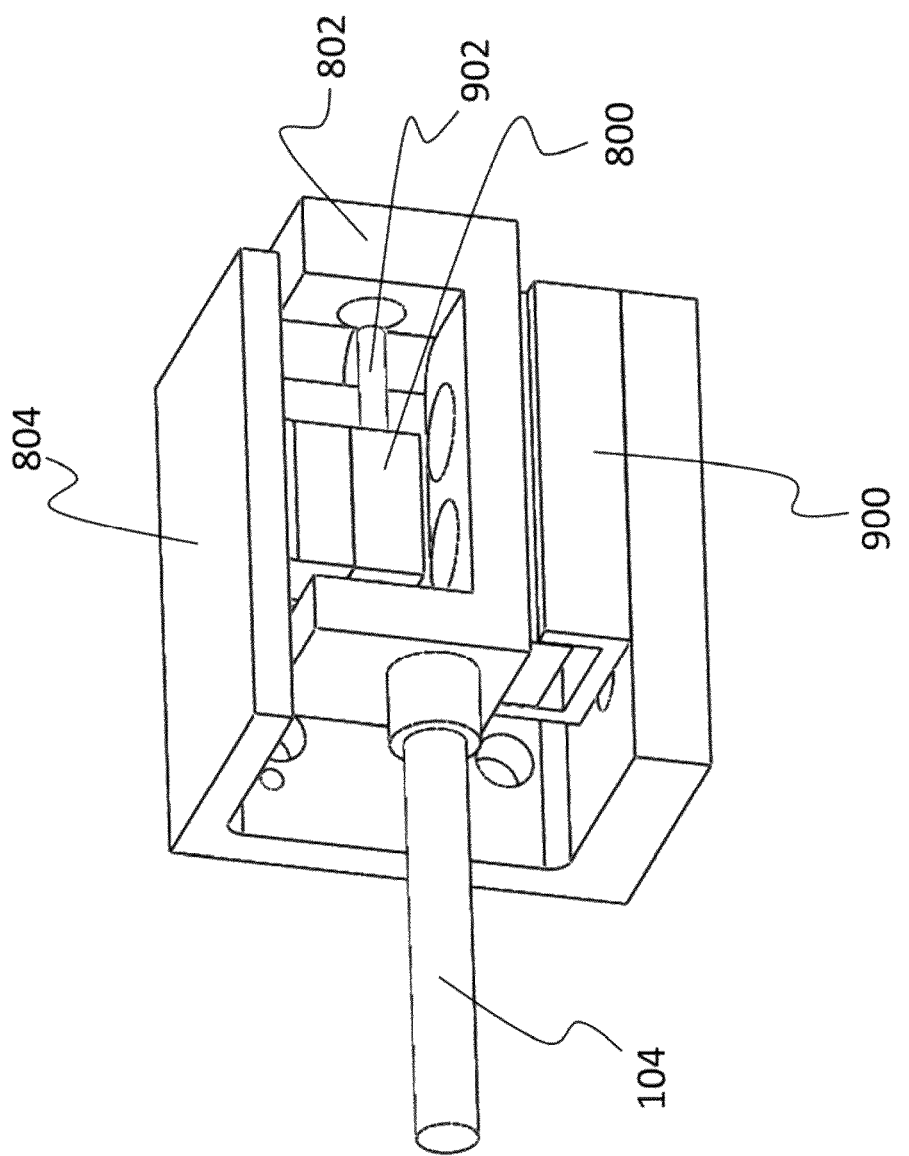
FIG. 9 is a perspective-view of a motor mounting structure according to the present invention.

FIG. 9 illustrates a motor mounting structure of one half of the tunable filter. A mechanical coupling (not shown) connected with the motor adaptor 802 provides a connection between the tuning rod 104 and the motor 800. The mechanical coupling is also designed to provide electrical isolation between the motor 800 and the tuning rod 104. A slide element 900 is attached with both the motor adaptor 802 and the motor mounting element 804. The dielectric cavity (not shown), motor 800, and slide element 900 are fixed. The motor 800 linearly translates an internal motor shaft 902. The motor shaft 902 is enclosed in the motor adaptor 802. Since the motor adaptor 802 is tied to the tuning rod 104, any displacement in the motor shaft 902 changes the position of the tuning rod 103 within the dielectric cavity (i.e., filter block). The slide element 900 helps constrain and mount the assembly while maintaining low frictional forces.

The motor 800 allows for tunability over a wide range of frequencies using the same tunable filter, such as might be needed for military applications. Alternatively, in another aspect, the tunable rods 104 can be tuned with the linear motors 800 during manufacturing and then locked in place to a set frequency (i.e., fixed frequency) for commercial applications. This would allow for reconfiguring of the tunable filter to fit the needs of a particular consumer using a set of standardized parts.

As described above, each resonator is tuned over a large frequency range by moving each tuning rod into and out of each dielectric cavity. Typical tuning rod displacements are on the order of millimeters, and tuning of more than one octave (e.g. 1000 MHz to 2000 MHz) can be achieved in practice. Measured data have shown that the tunable filter described herein can be continuously tuned from 1.4 GHz to 2.5 GHz by moving the tuning rods in and out of the dielectric cavities to adjust the tuning rod positions. Generally, a figure of merit (FOM) for a tunable bandpass filter is the product of the fractional filter bandwidth multiplied by the insertion loss. Using measured data, the filters have an FOM on the order of 2 (i.e. −1.0 dB insertion loss for a 2% fractional bandwidth). This FOM is excellent compared to alternative technologies for a wide tuning range filter.

Figure 10:
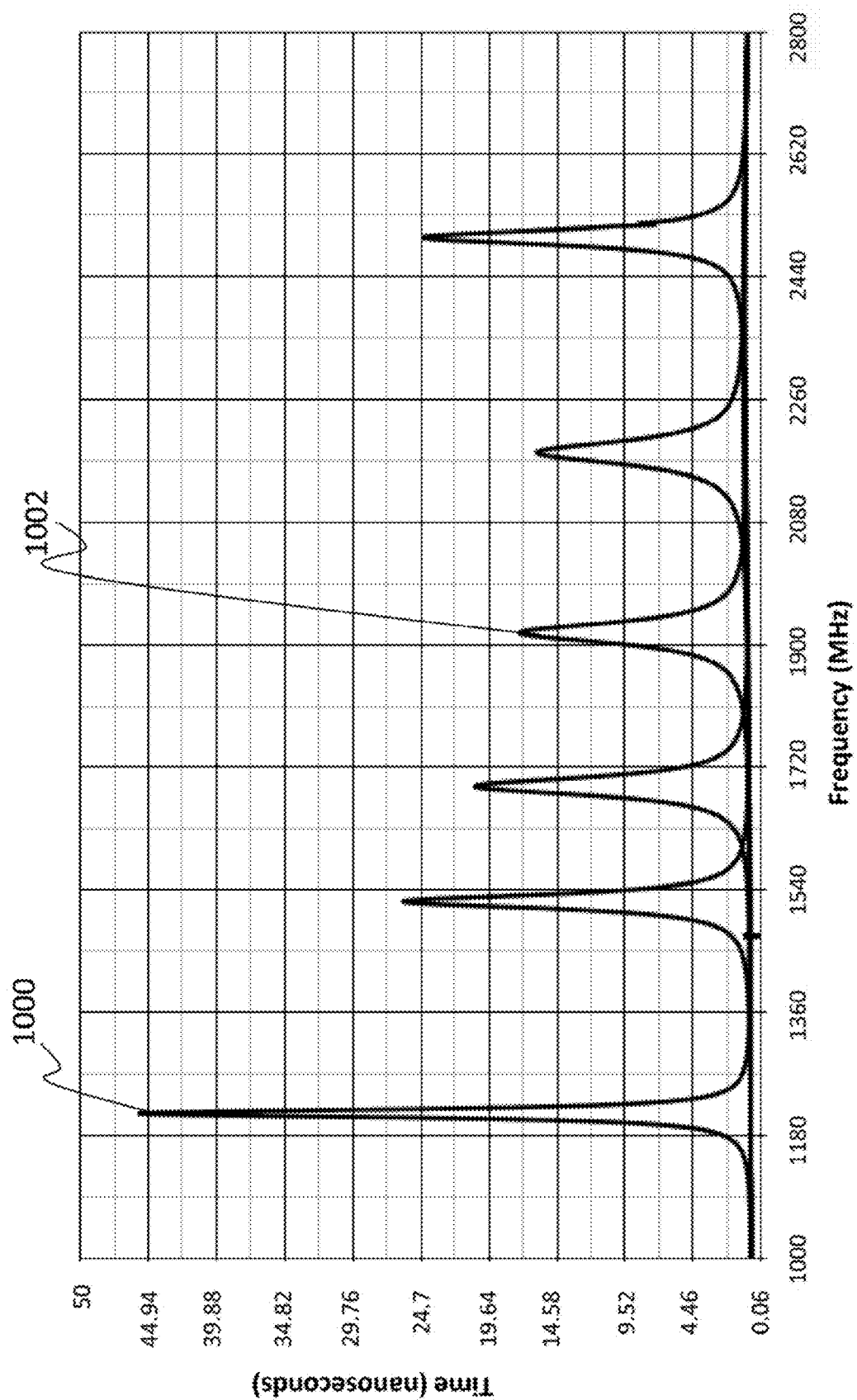
FIG. 10 is a graph depicting bandwidth variation of input coupling according to the present invention.

FIG. 10 is a graph depicting the simulated group delay response of a single section of ceramic block (dielectric cavity) coupled to an input coupling structure showing the frequency variation of filter input coupling. The position of the inductive coupling loop is varied to control the frequency variation of the input coupling. By removing the coupling aperture from the filter model, a 1-port simulation of each half of the filter is used to determine the approximate frequency scaling of the coupling. The graph of FIG. 10 shows the response as the tuning rod is inserted into the ceramic block, with a minimum tuning frequency of approximately 1200 MHz and a maximum tuning frequency near 2500 MHz. The coupling between the input coupling loop and the first resonant section of the tunable filter is related to the reflected group delay using the following equation:

$$\tau = \frac{4Q_e}{\omega_0},$$

where $\tau$ is the group delay determined from the phase of the reflected microwave signal, $\omega_0$ is the resonant frequency, and $Q_e$ is the external Q, which describes the strength of the coupling between the input coupling loop and the first resonator. In a filter with constant bandwidth, the group delay would be constant during tuning (i.e., a flat line). In contrast, and as shown in FIG. 10, the filter bandwidth varies by approximately 3:1 during tuning, as shown by the highest peak 1000 at approximately 45 nanoseconds (ns) and the lowest peak 1002 at approximately 15 ns. In this graph, a smaller peak represents stronger coupling between the input coupling loop and the resonator. Analyzing the equivalent filter bandwidth of the reflected group delay with both sides of the filter isolated first is advantageous, because the results do not require optimization of the cavity coupling aperture between each side, of the filter.

Figure 11:
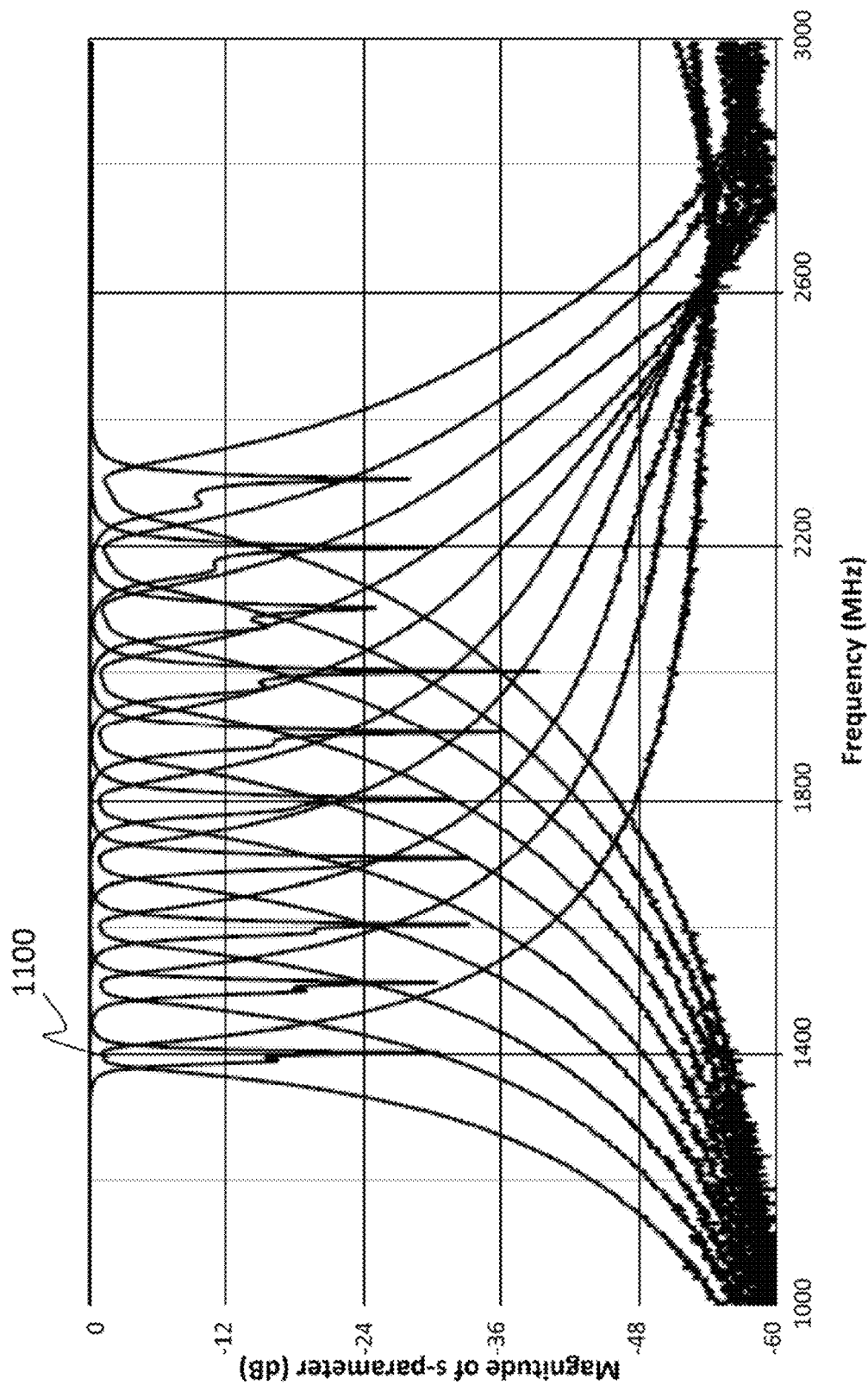
FIG. 11 is a graph depicting the measured s-parameter response of a 2-pole tunable bandpass filter according to the present invention.

In FIG. 11, the measured response of a complete tunable filter (i.e., two resonators) according to the present invention is shown with excellent performance, including low insertion loss (~1.0 dB), and wide tuning from 1400 MHz to 2300 MHz. The out of band isolation of the 2-pole filter is approximately 50 dB. Therefore, if the power in is 10 watts, then the power out is 1 milliwatt, or 5 orders of magnitude of isolation. An ideal situation would be no loss (i.e., 0 dB), where power in is equivalent to power out. As shown in FIG. 11, the inverse curves (e.g., 1100) peak at approximately 1.0 dB across the tuning frequencies in the present invention indicating a very low insertion loss.

Figure 12:
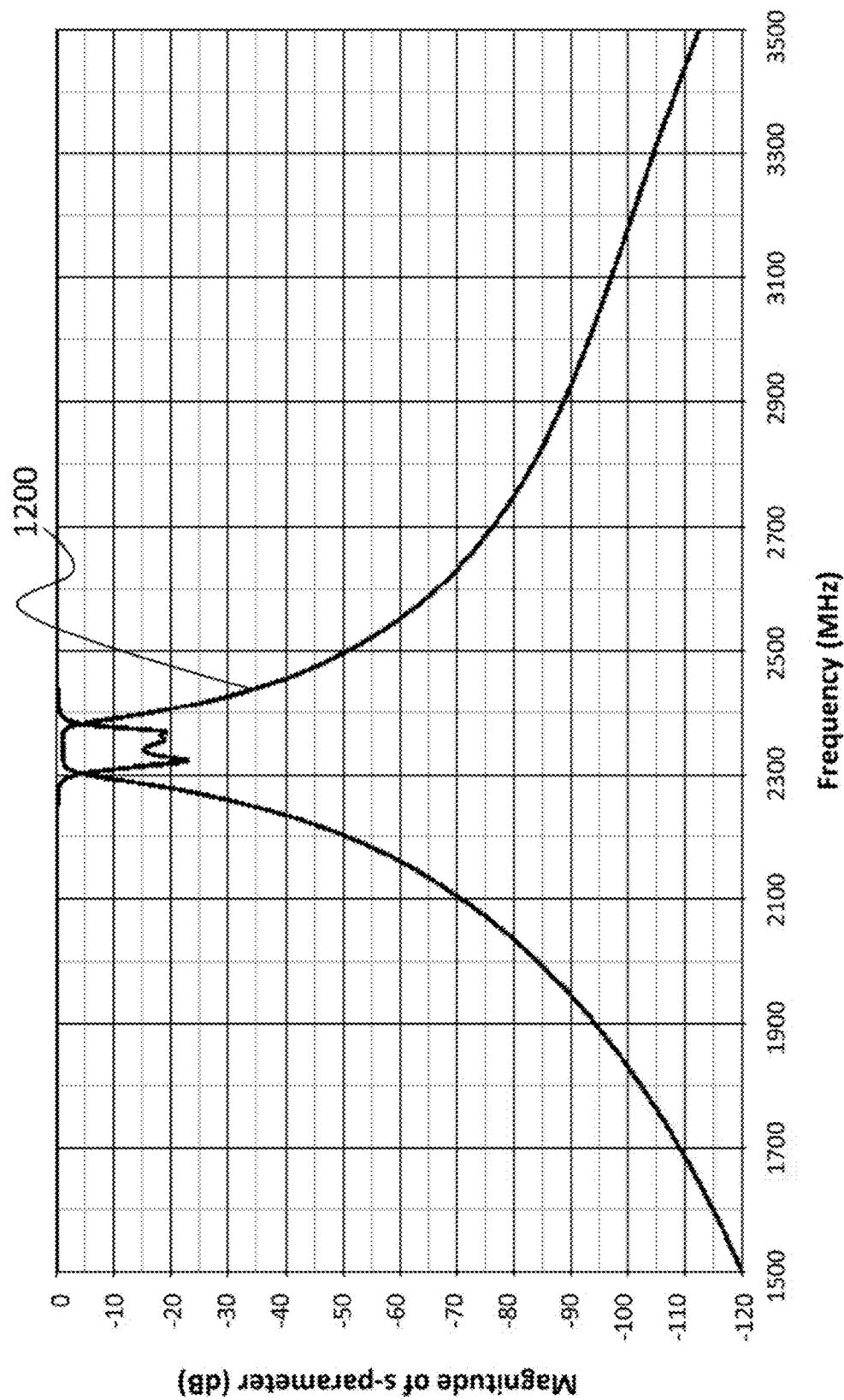
FIG. 12 is a graph depicting a simulated response of a 4-pole bandpass tunable filter according to the present invention.

FIG. 12 is a graph illustrating the simulated response of a higher order 4-pole bandpass filter tuned to 2300 MHz, which could be expected from a 4-pole filter, such as the filter depicted in FIG. 7. With an increased number of resonators, more drop-off is demonstrated as shown by the steeper curve 1200. Thus, with a greater number of resonators, greater selectivity of frequencies is achieved.

What is claimed is:

1. A miniature tunable filter, comprising:
   at least two adjacent coaxial-type resonators coupled to one another, wherein each resonator comprises:
      a ceramic dielectric cavity having an exterior surface and comprising a tuning rod passage extending through the ceramic dielectric cavity, wherein the exterior surface of the ceramic dielectric cavity comprises a metal coating;
      a mechanically tunable tuning rod insertable into the ceramic dielectric cavity, wherein the miniature tunable filter is tuned by linearly sliding the mechanically tunable tuning rod into and out of the tuning rod passage of the ceramic dielectric cavity, wherein the mechanically tunable tuning rod has a threadless exterior surface; and
      a low impedance coaxial section surrounding at least a portion of the mechanically tunable tuning rod to create an effective microwave short-circuit at a resonant frequency of the miniature tunable filter.

2. The miniature tunable filter as set forth in claim 1, wherein the mechanically tunable tuning rod is a solid metal tuning rod.

3. The miniature tunable filter as set forth in claim 2, wherein at least a portion of the threadless exterior surface of the mechanically tunable tuning rod is coated with a low-loss metal.

4. The miniature tunable filter as set forth in claim 3, wherein both the exterior surface of the ceramic dielectric cavity and the threadless exterior surface of the mechanically tunable tuning rod comprise polished surfaces with low surface roughness for minimal radio frequency (RF) losses.

5. The miniature tunable filter as set forth in claim 4, further comprising a cavity coupling aperture between the at least two adjacent coaxial-type resonators, wherein the cavity coupling aperture couples microwave energy between each coaxial-type resonator.

6. The miniature tunable filter as set forth in claim 5, wherein one of the at least two adjacent coaxial-type resonators further comprises an input coupling structure for exciting the tunable filter.

7. The miniature tunable filter as set forth in claim 6, wherein the tuning rod passage is sized to provide a close fit between the tuning rod passage and the mechanically tunable tuning rod.

8. The miniature tunable filter as set forth in claim 7, further comprising a respective linear motor connected to each of the corresponding mechanically tunable tuning rod of each coaxial-type resonator for driving movement of the corresponding mechanically tunable tuning rod.

9. The miniature tunable filter as set forth in claim 8, wherein the respective linear motor is a miniature piezoelectric motor.

10. The miniature tunable filter as set forth in claim 1, further comprising a cavity coupling aperture between the at least two adjacent coaxial-type resonators, wherein the cavity coupling aperture couples microwave energy between each coaxial-type resonator.

11. A method for forming a miniature tunable filter, comprising acts of:
    forming at least two adjacent coaxial-type resonators coupled to one another, wherein the formation of each coaxial-type resonator comprises acts of:
       forming a ceramic dielectric cavity having an exterior surface and forming a tuning rod passage extending through the ceramic dielectric cavity, wherein the exterior surface of the ceramic dielectric cavity comprises a metal coating;
       forming and inserting a mechanically tunable tuning rod having a threadless exterior surface into the rod passage of the ceramic dielectric cavity, wherein the miniature tunable filter is tuned by linearly sliding the mechanically tunable tuning rod into and out of the tuning rod passage of the ceramic dielectric cavity; and
       forming a low impedance coaxial section and surrounding at least a portion of the mechanically tunable tuning rod with the low impedance coaxial section to create an effective microwave short-circuit at a resonant frequency of the miniature tunable filter.

12. The method for forming a miniature tunable filter as set forth in claim 11, further comprising an act of forming the mechanically tunable tuning rod as a solid metal tuning rod.

13. The method for forming a miniature tunable filter as set forth in claim 12, further comprising an act of coating at least a portion of the threadless exterior surface of the mechanically tunable tuning rod with a low-loss metal.

14. The method for forming a miniature tunable filter as set forth in claim 13, further comprising acts of forming both the exterior surface of the ceramic dielectric cavity and the threadless exterior surface of the mechanically tunable tuning rod to have polished surfaces with low surface roughness for minimal radio frequency (RF) losses.

15. The method for forming a miniature tunable filter as set forth in claim 14, further comprising an act of forming a cavity coupling aperture between the at least two adjacent coaxial-type resonators, wherein the cavity coupling aperture couples microwave energy between each coaxial-type resonator.

16. The method for forming a miniature tunable filter as set forth in claim 15, further comprising an act of connecting an input coupling structure to one of the at least two adjacent coaxial-type resonators for exciting the tunable filter for exciting the ceramic dielectric cavity.

17. The method for forming a miniature tunable filter as set forth in claim 16, further comprising an act of sizing the tuning rod passage to provide a close fit between the tuning rod passage and the mechanically tunable tuning rod.

18. The method for forming a miniature tunable filter as set forth in claim 17, further comprising an act of connecting a respective linear motor to each of the corresponding mechanically tunable tuning rod of each coaxial-type resonator for driving movement of the corresponding mechanically tunable tuning rod.

19. The method for forming a miniature tunable filter as set forth in claim 18, further comprising an act of forming the respective linear motor as a miniature piezoelectric motor.

20. The method for forming a miniature tunable filter as set forth in claim 11, further comprising an act of forming a cavity coupling aperture between the at least two adjacent coaxial-type resonators, wherein the cavity coupling aperture couples microwave energy between each coaxial-type resonator.

* * * * *